US006373067B1

(12) United States Patent
Shimomura

(10) Patent No.: US 6,373,067 B1
(45) Date of Patent: Apr. 16, 2002

(54) MASS SPECTROMETER

(75) Inventor: Manabu Shimomura, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/546,469

(22) Filed: Apr. 10, 2000

(30) Foreign Application Priority Data

Jun. 14, 1999 (JP) .......................................... 11-166783

(51) Int. Cl.[7] .............................................. H01J 37/244

(52) U.S. Cl. ....................................... 250/397; 250/283

(58) Field of Search ................................ 250/397, 283, 250/299, 300; 313/105 CM

(56) References Cited

U.S. PATENT DOCUMENTS 5,374,827 A * 12/1994 Roy .......................... 250/397

* cited by examiner

*Primary Examiner*—Kiet T. Nguyen
(74) *Attorney, Agent, or Firm*—Beyer Weaver & Thomas LLP

(57) ABSTRACT

A mass spectrometer, having an electron multiplier tube to serve as an ion detector, includes a voltage source for applying a suddenly rising voltage to the electron multiplier tube while no ions to be detected are being introduced and an inspecting apparatus for detecting the induced voltage generated in the electron multiplier tube when this suddenly rising voltage is applied. The condition of the wiring connections can be determined by analyzing the behavior of the measured induced voltage.

4 Claims, 2 Drawing Sheets

MASS SPECTROMETER

BACKGROUND OF THE INVENTION

This invention relates to a mass spectrometer having an electron multiplier tube serving as an ion detector.

A mass spectrometer usually uses an electron multiplier tube as the ion detector. The electron multiplier tube usually has many metallic electrode plates arranged in a longitudinal array, each having a different voltage applied thereto. As a relatively small number of ions are introduced through an entrance slit and are made to collide with the first of these metallic electrode plates, a larger number of secondary electrons are emitted therefrom and these secondary electrons are then caused to collide with the next metallic electrode plate of the array such that a still larger number of electrons are emitted. This process is repeated many times so as to multiply electrons.

After such an electron multiplier tube has been used for a long period of time, the surface condition of its electrode plates changes significantly due to the collisions with ions and electrons and the tube ceases to multiply electrons with the same efficiency as when it was new. The surfaces of the electrode plates are also gradually contaminated by the impurity molecules which remain in the vacuum chamber. In other words, electron multiplier tubes must be regarded as articles of consumption and must be replaced every so often, after having been in use for some time.

There are many lines to be disconnected and connected again whenever an electron multiplier tube is replaced, such as high-voltage lines and grounding lined for applying DC bias voltages to the electrode plates, of which there are many, and a signal line through which detection signals are to be outputted. When a new electron multiplier tube is connected, various tests are carried out to look for errors in connections but it sometimes happens that the connections may appear proper at the time of the replacement but that the proper connection is lost by the time the tube is assembled and its operation is actually started. Situations of such an incomplete contact could not be adequately detected according to the prior art technology.

SUMMARY OF THE INVENTION

It is therefore an object of this invention, in view of this problem of prior art technology, to provide an improved mass spectrometer which, although of a simple structure, allows the testing of the connections between its electron multiplier tube and the surrounding elements under the same conditions of its actual use.

A mass spectrometer embodying this invention, with which the above and other objects can be accomplished, may be characterized as comprising a voltage applying means for applying to its electron multiplier tube a suddenly rising voltage while no ions to be detected are being introduced into the electron multiplier tube and an inspecting means for detecting the induced voltage generated in the electron multiplier tube when this suddenly rising voltage is applied thereto and to determine the condition of the wiring connections on the basis of the measured induced voltage.

Since an electron multiplier tube is provided with a source of a high DC voltage (from one to several kilovolts) for applying various bias voltages to the plurality of its electrode plates, such a voltage source may be used as the aforementioned voltage applying means. The induced voltage may be measured from the detected output from the electron multiplier tube. In other words, no new elements are required to form a mass spectrometer of this invention from a prior art mass spectrometer or to make proper wire connections.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings.

DETAILED DESCRIPTION OF THE INVENTION

Figure 1:
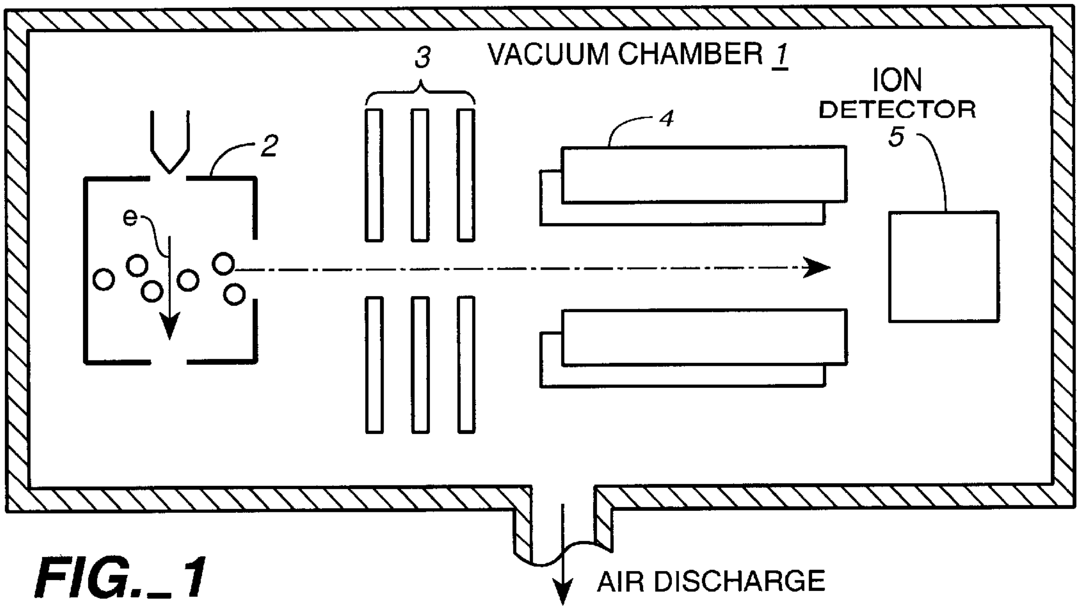
FIG. 1 is a schematic structural diagram of a mass spectrometer embodying this invention.

The invention is described next by way of an example. As shown in FIG. 1, a vacuum chamber 1 contains therein an ion source 2 for ionizing the sample molecules, say, by electron bombardment, ion lenses 3 for forming a convergent beam from the generated ions, a mass separator 4 for separating these ions according to their mass numbers and an ion detector 5 for detecting the separated ions. In this example, an electron multiplier tube is used as the ion detector 5, and a quadrupole filter is shown as the mass separator 4 but a mass separator of a different type may be substituted. The ion source 2, too, may be of a different type, say, a device employing a chemical ionization process.

The electron multiplier tube, which serves as the ion detector 5 in this example, is formed with a plurality of (six according to this example but may be a different plural number) curved electrode plates 10*a*–10*f*, a resistor array 11 for applying different voltages to these electrode plates 10*a*–10*f*, and an electron collector 12 for finally capturing the electrons. A high-voltage line 13 of the electron multiplier tube 5 is pulled out of the vacuum chamber 1 and connected to a high-voltage source 22 through a switch 21. There is also a grounding line 14 which is similarly pulled out of the vacuum chamber 1 and is grounded. A signal line 15 connected to the collector 12 of the electron multiplier tube 5 is pulled out of the vacuum chamber 1 and is connected to a preamplifier 20. The output from the preamplifier 20 is transmitted to a signal processor (not shown) for carrying out various signal processing at the time of carrying out measurements and also to a wiring inspection part 25 which comprises a comparator 26, a time detector 27 and a judging unit 28.

A control unit 23 for the mass spectrometer may be formed with a CPU and functions as follows when carrying out an automatic adjustment process on the voltages applied to the ion lenses 3 and the mass separator 4 with respect to the mass numbers. Firstly, the switch 21 is set in the ON condition while the ions are not being generated, that is, while no heat-generating current is being supplied to the filament (not shown) for generating thermal electrons. The voltage of the high-voltage source 22 may be set appropriately within the range of one to several kilovolts.

Figure 2:
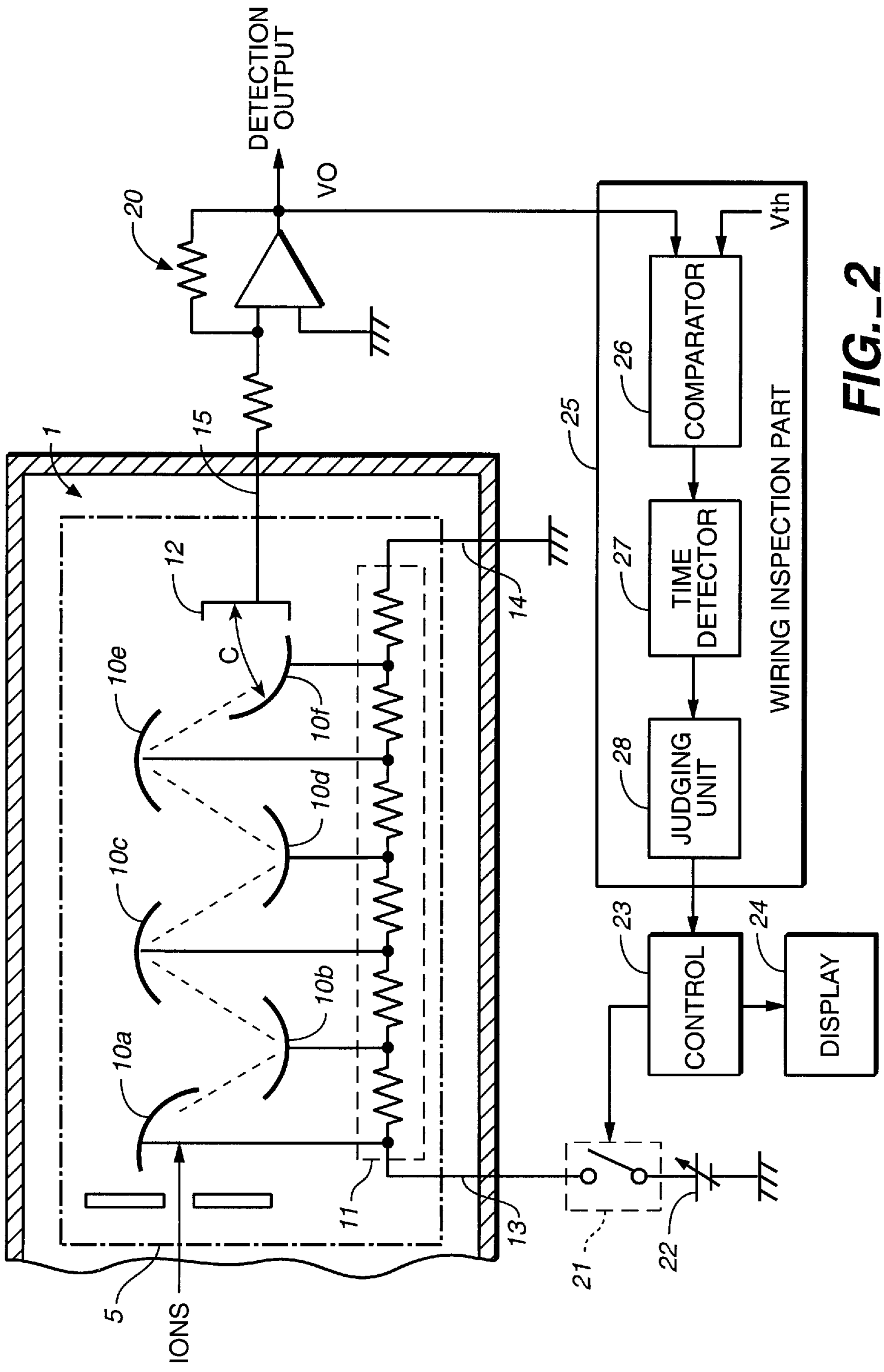
FIG. 2 is a schematic block diagram of the mass spectrometer of FIG. 1.

As the switch 21 is connected when the high-voltage line 13 and the grounding line 14 are connected properly, specified voltages are individually applied to the electrode plates 10*a*–10*f* of the electron multiplier tube 5, as divided by the resistor array 11. Since the electron collector 12 is disposed close to the last of the electrode plates (10*f*) (as symbolically indicated by capacitance C therebetween in FIG. 2), an induced voltage is generated on this collector 12 instantaneously as a voltage is applied to this last-stage electrode plate 10*f*, becoming lower exponentially with time thereafter. If the collector 12 and the preamplifier 20 are connected properly, a similarly varying voltage appears also in the output from the preamplifier 20.

Figure 3:
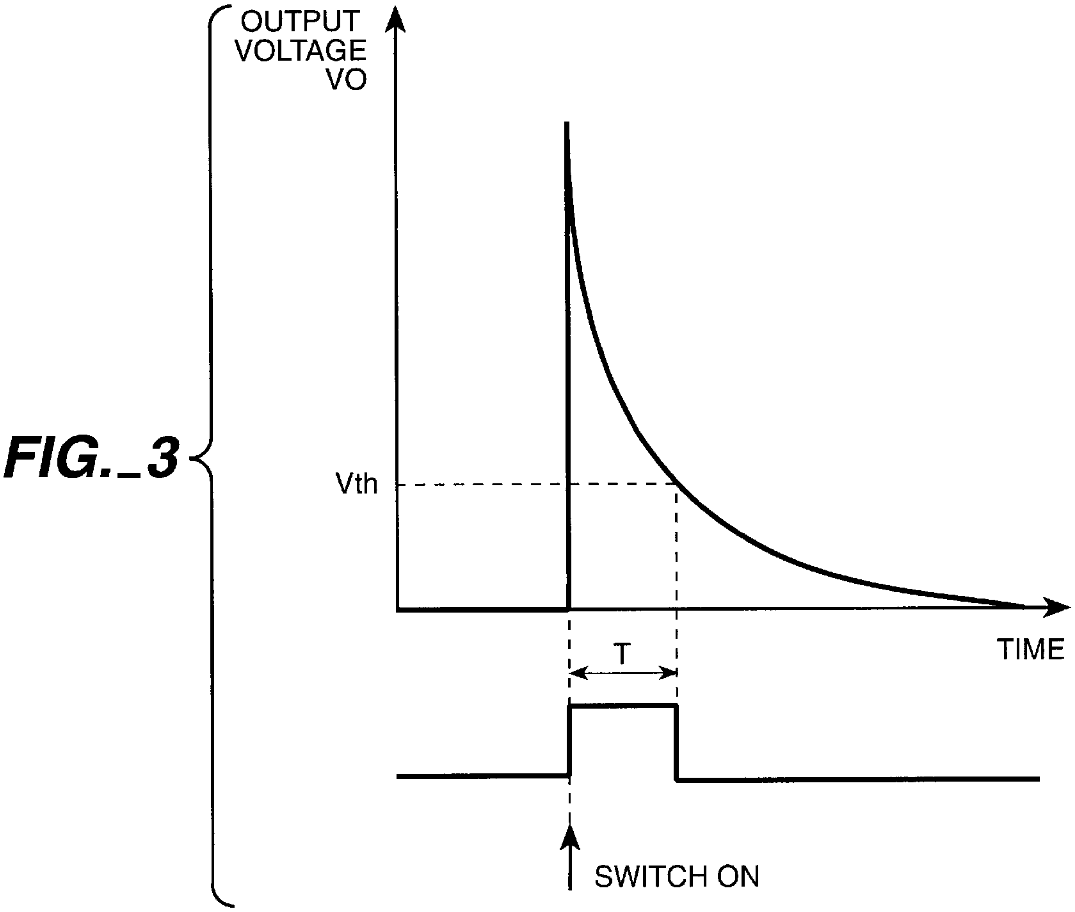
FIG. 3 is a waveform diagram which may be obtained typically for testing wire connections of the mass spectrometer according to this invention.

FIG. 3 shows a waveform diagram which may be obtained typically, indicating the changes in the output voltage $V_0$ from the preamplifier 20. The comparator 26 of the wiring inspection part 25 serves to compare this output voltage $V_0$ with a specified threshold voltage $V_{th}$ and to generate a signal having a rectangular waveform during the period in which the output voltage $V_0$ exceeds this threshold voltage $V_{th}$. The time detector 27, upon receiving this signal with the rectangular waveform, functions to measure the pulse width T of this received signal, and the judging unit 28 determines whether this pulse width T is greater than a specified critical value or not. If the pulse width T is found to be greater than this critical value, a detection signal indicating that the connection is normal is outputted to the control unit 23 which responds by causing a display made on the display device 24 that the connection is normal.

If there is any defective connection among the high-voltage line 13, the grounding line 14 and the signal line 15, the output from the preamplifier does not undergo any substantial changes and the time detector 27 of the wiring inspection part 25 will detect T=0 and the judging unit 28 will transmit another detection signal to the control unit 23, indicative of a defective connection. Thereupon, the control unit 23 causes a warning display made on the display device 24.

The invention has been described above by way of only one example, but this example is not intended to limit the scope of the invention. Many modifications and variations are possible within the scope of this invention. For example, the inspection routine described above may be adapted to be carried out automatically while the mass spectrometer is not undergoing any analysis or in response to a specified start signal inputted by the user. The advantage of this invention is that any defective wiring connections to the electron multiplier tube can be detected from outside while the tube is under the same condition as when it will be being used for an actual analysis. Thus, the present invention can prevent the user from continuing the analysis when the wiring connections are less than perfect. Still another advantage of this invention is that an improved mass spectrometer with such capability can be obtained without any large additional components but only with a small addition of a few hardware and software.

What is claimed is:

1. A mass spectrometer comprising:

an electron multiplier tube serving as an ion detector;

voltage applying means for applying a suddenly rising voltage to said electron multiplier tube while no ions to be detected are being introduced into said electron multiplier tube; and inspecting means for detecting an induced voltage generated in said electron multiplier tube in response to said suddenly rising voltage and thereby determining whether wire connections of said electron multiplier tube are normal or not.

2. The mass spectrometer of claim 1 wherein said inspecting means includes:

a comparator for comparing an output voltage from said electron multiplier tube when said suddenly rising voltage is applied thereto with a specified threshold voltage and generating a rectangular voltage during a period while said output voltage exceeds said threshold voltage;

a time detector for detecting said period; and judging means for judging whether said detected period is longer than a specified critical time length.

3. The mass spectrometer of claim 2 further comprising a control unit and a display device, said control unit serving to cause said display device to display whether said detected period is longer than a specified critical time length.

4. The mass spectrometer of claim 1 wherein said electron multiplier tube includes an array of electrode plates aligned from a first plate to a last plate and an electron collector which is disposed proximally to said last plate of said array, said induced voltage being detected by said inspecting means on said electron collector.

* * * * *